United States Patent
Kadowaki et al.

(10) Patent No.: US 8,163,842 B2
(45) Date of Patent: Apr. 24, 2012

(54) TRANSPARENT COMPOSITE MATERIAL AND PROCESS FOR PRODUCING THE SAME

(75) Inventors: Yasushi Kadowaki, Kawasaki (JP); Kenji Shimamura, Kawasaki (JP); Ryoji Toita, Kawasaki (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 12/937,844

(22) PCT Filed: Apr. 13, 2009

(86) PCT No.: PCT/JP2009/057427
§ 371 (c)(1), (2), (4) Date: Oct. 14, 2010

(87) PCT Pub. No.: WO2009/128414
PCT Pub. Date: Oct. 22, 2009

(65) Prior Publication Data
US 2011/0040015 A1    Feb. 17, 2011

(30) Foreign Application Priority Data
Apr. 14, 2008    (JP) .................. 2008-104768

(51) Int. Cl.
*C08L 83/02* (2006.01)
(52) U.S. Cl. .......... 524/859; 524/847; 524/855
(58) Field of Classification Search .......... 524/847, 524/859, 855; 427/372.2
See application file for complete search history.

(56) References Cited

U.S. PATENT DOCUMENTS

| 4,874,728 A | 10/1989 | Eilliott et al. |
| 2007/0072116 A1 | 3/2007 | Yamasaki et al. |
| 2007/0129502 A1 | 6/2007 | Kawabe et al. |

FOREIGN PATENT DOCUMENTS

| EP | 1473329 A1 | 11/2004 |
| JP | 2000-109526 A | 4/2000 |
| JP | 2007-118579 A | 5/2007 |
| JP | 2007-182519 A | 7/2007 |
| JP | 2007-268711 A | 10/2007 |
| JP | 2008-045121 A | 2/2008 |
| WO | WO 03/018477 A1 * | 3/2003 |
| WO | 2008/010610 A1 | 1/2008 |
| WO | WO 2008/010610 A1 * | 1/2008 |

* cited by examiner

*Primary Examiner* — Ling Choi
(74) *Attorney, Agent, or Firm* — Sughrue Mion, PLLC

(57) ABSTRACT

This invention relates to a method for producing a transparent composite material comprising a first step of subjecting a synthetic smectite having a number average particle diameter of from 10 to 300 nm and an aspect ratio of from 10 to 300 to organizing treatment with an organic quaternary ammonium salt and/or an organic quaternary phosphonium salt; a second step of mixing the synthetic smectite subjected to organizing treatment and a curable resin to prepare a resin composition containing the synthetic smectite in an amount of 10 to 40 mass %; a third step of curing the resin composition to obtain a cured product; and a forth step of removing the organic volatile components remaining in the cured product. According to the method, a transparent composite material which is flexible and has a low coefficient of thermal expansion can be obtained which is reduced in outgassing at high temperature under vacuum as in vapor deposition of a conductive thin film.

12 Claims, No Drawings

TRANSPARENT COMPOSITE MATERIAL AND PROCESS FOR PRODUCING THE SAME

TECHNICAL FIELD

The present invention relates to a transparent composite material and a method for producing the same. Specifically, the present invention relates to a transparent composite material having both the flexibility and a small coefficient of thermal expansion; and a method for producing the same.

BACKGROUND ART

Glass has been widely used as a substrate for a display device such as a liquid crystal display device and an organic EL display device, a substrate for a color filter, a substrate for a solar cell, and the like. In recent years, however, a plastic material is being considered as a substitute for a glass substrate owing to such reasons that the glass substrate is liable to fracture, cannot be bent, is not suitable for reduction in weight due to the large specific gravity thereof, and the like. For example, substrates made of polyethylene terephthalate, polyethylene naphthalate, polycarbonate, polyolefin and polyethersulfone are proposed (for example, in JP-A-2007-268711, Patent Document 1).

It has been disclosed that though these conventional plastic materials as a substitute for glass have a larger linear coefficient of thermal expansion compared to glass, the linear coefficient of thermal expansion can be reduced by dispersing tabular inorganic substance in a plastic material (e.g. JP-A-2008-45121; Patent Document 2 (WO 2008/010610)).

Conventionally, in plastic substrates for a display, a transparent electrode on the substrate is formed by forming a film of an oxide of a metal such as indium and tin on plastic in vacuum by a method such as argon sputtering and ion plating. In that case, a high degree of vacuum is required for forming a film of the metal oxide from an evaporation source of the metal oxide on the surface of the plastic uniformly. Also, to obtain an oxide film having a low resistance value, it is necessary to raise the substrate to high temperature to thereby attain high crystallinity degree of the oxide film.

However, these conventional plastic materials as a substitute for glass have had a problem that unreacted monomer and other low-molecular-weight components vaporizes from the inside of the material upon the vapor deposition of a conductive thin film on the material surface at high temperature and under vacuum, which leads to a lower degree of vacuum in the vapor deposition apparatus and inhibits normal deposition. Hence, a plastic material containing a small amount of volatile components has been demanded.

PRIOR ART DOCUMENTS

Patent Documents

Patent Document 1: JP-A-2007-268711
Patent Document 2: JP-A-2008-45121

DISCLOSURE OF THE INVENTION

Problems to be Solved by the Invention

The present invention provides a method for producing a transparent composite material which is reduced in outgassing upon vapor deposition of a conductive thin film upon heating under vacuum atmosphere and enabling normal formation of a thin film; and a transparent composite material obtained by the method.

Means to Solve the Problem

As a result of intensive studies to solve the above problem, the present inventors have found that, by producing a transparent composite material in which the amount of volatile components contained in the material has been reduced prior to vacuum heating, the conventional problem which occurred during the subsequent vapor deposition of the conductive film can be solved; and accomplished the present invention based on the finding.

That is, the present invention relates to the method for producing a transparent composite material, a transparent composite material obtained by the method, and a display device and a substrate for a solar cell comprising the transparent composite material as a substrate as described below.
[1] A method for producing a transparent composite material comprising a first step of subjecting a synthetic smectite having a number average particle diameter of from 10 to 300 nm and an aspect ratio of from 10 to 300 to organizing treatment with a quaternary ammonium salt and/or a quaternary phosphonium salt; a second step of mixing the synthetic smectite subjected to organizing treatment and a curable resin to prepare a resin composition containing the synthetic smectite in an amount of 10 to 40 mass %; a third step of curing the resin composition to obtain a cured product; and a fourth step of removing the organic volatile components remaining in the cured product.
[2] The method for producing a transparent composite material as described in [1] above, wherein the fourth step of removing the organic volatile components is washing with a solvent and/or heating the material.
[3] The method for producing a transparent composite material as described in [2] above, wherein the heating atmosphere of the material is any one of air atmosphere, inert gas atmosphere, or vacuum atmosphere under reduced pressure.
[4] The method for producing a transparent composite material as described in [1] above, wherein the synthetic smectite is at least one member selected from synthetic hectorite, synthetic saponite and synthetic stevensite.
[5] The method for producing a transparent composite material as described in [1] above, wherein the quaternary organic ammonium salt is at least one member selected from lauryltrimethylammonium salt, stearyltrimethylammonium salt, trioctylmethylammonium salt, distearyldimethylammonium salt, di-hydrogenated beef tallow dimethylammonium salt, distearyldibenzylammonium salt and N-polyoxyethylene-N-lauryl-N,N-dimethylammonium salt.
[6] The method for producing a transparent composite material as described in [1] above, comprising a step of treating the terminal hydroxy groups of the synthetic smectite by a surface modification agent before the second step.
[7] The method for producing a transparent composite material as described in [1] above, wherein the curable resin is ally ester resin and/or vinyl ester resin.
[8] The method for producing a transparent composite material as described in [6] above, wherein the surface modification agent is selected from silane coupling agent, a titanate coupling agent, a glycidyl compound and an isocyanate compound.
[9] The method for producing a transparent composite material as described in [1] above, wherein a solvent is further added in the second step of preparing the resin composition.

[10] A transparent composite material produced by the method described in any one of [1] to [9] above.

[11] A display device comprising a transparent composite material described in [10] above as a substrate.

[12] The display device according to [11] above, wherein the display device is a liquid crystal display, organic EL display or electronic paper.

[13] A substrate for a solar cell comprising the transparent composite material according to [10] above as a substrate.

Effects of the Invention

The conventional plastic material has a problem that unreacted monomer and other low-molecular-weight components vaporizes from the inside of the material upon the vapor deposition of a conductive thin film on the material surface at high temperature and under vacuum, which leads to a lower degree of vacuum in the vapor deposition apparatus and inhibits normal deposition. According to the present invention, a transparent composite material having a small content of volatile components can be obtained by reducing the amount of volatile components contained in the material in advance, thereby enabling the formation of a low-resistance conductive thin film on the surface of a transparent composite material, which material is highly useful as a transparent conductive substrate for a display material and the like. Also, since the present invention can provide a transparent sheet having both of the flexibility and a small coefficient of thermal expansion by employing a specific resin composition, which sheet can be used in a flexible display, a solar cell and the like.

EMBODIMENT FOR CARRYING OUT THE INVENTION

[Transparent Composite Material]

The transparent composite material of the present invention is a resin cured product in which a synthetic smectite having a number average particle diameter of from 10 to 300 nm and an aspect ratio of from 10 to 300 is dispersed. Generally, the transparent composite material can be obtained by mixing and curing the synthetic smectite and a resin composition.

A glass cloth, nanosilica and the like have been known as a filler that is capable of improving mechanical characteristics and thermal characteristics of a resin while maintaining transparency thereof. However, a glass cloth has a coefficient of thermal expansion that is largely different from a resin, and thus the resin is whitened due to microcracks upon heating and cooling to lose transparency of the material. In the case where nanosilica is filled, the transparency can be maintained when the addition amount thereof is small, but it is necessary to fill nanosilica in a large amount for attaining such a low coefficient of thermal expansion that is required for use as a display substrate and a substrate for a solar cell, and the transparency cannot be maintained in this case. In the case where natural clay, such as bentonite and the like, is filled, mechanical characteristics and thermal characteristics can be improved, but impurities, such as iron oxide, quartz and the like, in the natural clay crystals cannot be completely removed, thereby failing to improve all mechanical characteristics, thermal characteristics and transparency.

The present inventors have found that an allyl ester resin composition and/or a vinyl ester resin composition in which the synthetic smectite having specific characteristics is dispersed becomes a transparent composite material having a significantly small linear expansion coefficient.

In the invention, the transparency of the transparent composite material is evaluated in terms of total light transmittance. The transparent composite material of the invention has a total light transmittance of 85% or more per 100 μm in thickness, and a haze value of 5% or less. The total light transmittance is more preferably 90% or more. The transparent composite material preferably has a haze value of 3% or less. In the case where the haze value exceeds 5%, transmitted light is distorted to lose vividness. The total light transmittance is measured according to JIS K7361-1, and the haze value is measured according to JIS K7136.

The transparent composite material of the invention is not limited in shape, and a molded article in a shape of a film, sheet, plate and the like is particularly preferred. An article having a thickness of from 10 to 200 μm is referred to as a film, an article having a thickness of larger than 200 μm and 5,000 μm or less is referred to as a sheet, and an article having a thickness larger than 5,000 μm is referred to as a plate, but hereinafter, the articles are referred to as sheets irrespective of the thickness of the film, sheet or plate.

[Method for Producing a Transparent Composite Material (Transparent Sheet)]

The method for producing a transparent composite material of the present invention comprises a first step of subjecting a synthetic smectite having a number average particle diameter of from 10 to 300 nm and an aspect ratio of from 10 to 300 to organizing treatment with an organic quaternary ammonium salt and/or an organic quaternary phosphonium salt; a second step of mixing the synthetic smectite subjected to organizing treatment and a curable resin to prepare a resin composition containing the synthetic smectite in an amount of 10 to 40 mass %; a third step of curing the resin composition to obtain a cured product; and a fourth step of removing the organic volatile components remaining in the cured product.

In the first step of the method for producing a transparent composite material of the present invention, a specific synthetic smectite is subjected to organizing treatment with an organic quaternary ammonium salt and/or an organic quaternary phosphonium salt. In the present invention, a commercially available synthetic smectite can be used as well, which has been organically treated. That is, the present invention also includes a method for producing a transparent composite material using a commercially available synthetic smectite which has been organically treated.

In the second step, a resin composition containing synthetic smectite in an amount of 10 to 40 mass % is prepared by mixing organically-treated synthetic smectite and a curable resin. Further, the resin composition may contain as other components reactive monomer, curing agent, additives and other radically reactive resin components.

The mixture of the synthetic smectite, the resin composition and the solvent can be produced, for example, by (1) a method of mixing a solution containing the resin component dissolved in a solvent and a dispersion liquid containing the synthetic smectite dispersed in a solvent, (2) a method of adding and dissolving the resin component directly to a dispersion liquid containing the synthetic smectite dispersed in a solvent, (3) a method of adding and dispersing the synthetic smectite to the resin component having been dissolved in a solvent, or (4) a method of dissolving and dispersing a mixture obtained by heating and kneading the resin component and the synthetic smectite in a solvent. Among these, such a method is particularly preferred that a solution containing the resin component dissolved in a solvent and a dispersion liquid containing the synthetic smectite dispersed in a solvent are mixed, from the standpoint of dispersibility of the synthetic smectite. The dispersing method is not particularly limited, and a known method may be used, such as a MixRotor, a magnetic stirrer, a homogenizer, a Henschel mixer, a beads mill, an ultra-high pressure atomizing device and application of ultrasonic wave; and by heating in combination with these methods as needed.

Next, in the third step, a resin composition is applied on the substrate and cured by any one of electron beam (EB) irradiation, ultraviolet (UV) irradiation or heating.

The mixed liquid of the synthetic smectite, the resin composition and the solvent is depressurized for deaeration and concentration, whereby the viscosity of the mixed liquid is controlled to a viscosity that is optimum for coating. The viscosity of the mixed liquid is not particularly limited, but it is preferred that the viscosity is suitable for the forming method. For example, in the case of a roll coating method and a doctor knife coating method, the viscosity is preferably in a range of from 0.01 to 1,000 Pa·s at 25° C. A viscosity of less than 0.01 Pa·s or exceeding 1,000 Pa·s is not preferred since the workability is deteriorated. In the case where the viscosity is too high at ordinary temperature, the workability can be improved by increasing the temperature of the mixed liquid. In the case where the depressurizing time is short, gaseous matters in the mixed liquid cannot be sufficiently removed and form bubbles upon coating, drying and curing steps, thereby failing to provide a smooth transparent sheet.

In the application, the mixed liquid having been deaerated and controlled in viscosity by concentrating under reduced pressure is used as a coating composition, and is coated on a smooth substrate such as glass, metal and a plastic film by a method that is ordinarily employed industrially, such as a direct gravure method, a reverse gravure method, a microgravure method, a roll coating method such as a two-roll bead coating method and a bottom feed three-roll reverse coating method, a doctor knife coating method, a die coating method, a dip coating method, a bar coating method, a coating method combining these methods, and the like. Among these, a roll coating method and a doctor knife coating method are preferred since these methods apply a force functioning in parallel to the substrate (shearing force) for orienting the synthetic smectite in the plane direction. The term "orienting in the plane direction" means that most of the synthetic smectite is oriented in parallel to the surface of the substrate. In the case where the synthetic smectite layers are oriented in the plane direction, the coefficient of thermal expansion of the transparent sheet in the plane direction can be effectively decreased. Furthermore, the layers of the synthetic smectite are oriented in the plane direction, whereby the total light transmittance is high even if the content of the synthetic smectite is large.

In the case where a solvent that is capable of being evaporated is used for dispersing the synthetic smectite and for controlling the viscosity, the synthetic smectite can be further oriented in the plane direction. Specifically, the mixture of the synthetic smectite, resin and the solvent is applied on the substrate, and then only the solvent is evaporated, whereby the coating composition is contracted only in the thickness direction, thereby further orienting the synthetic smectite in the plane direction in the resin. In the case where the reactive monomer is used, it is preferred that a reactive monomer that has relatively low volatility is used in combination with a solvent having high volatility, and the solvent is dried under suitable conditions (such as temperature, pressure and time). The method of orienting the synthetic smectite in the plane direction by evaporating the solvent can be employed in combination with the roll coating method and/or the doctor knife coating method mentioned above, but a coating method without application of shearing force may be employed solely.

The temperature, at which the solvent is evaporated, is preferably from 0 to 200° C. A temperature of lower than 0° C. is not preferred since the evaporation speed becomes significantly lowered. A temperature exceeding 200° C. is not preferred since bubbling of the solvent due to rapid evaporation and boiling or gelation of the resin occurs, which results in possibilities of decrease in surface smoothness and increase in haze value. The temperature is more preferably from 10 to 100° C. The pressure, at which the solvent is evaporated, is preferably from 10 Pa to 1 MPa. A pressure of lower than 10 Pa is not preferred since bumping may occur, which results in possibilities of decrease in surface smoothness and increase in haze value. The pressure is more preferably from 10 to 200 Pa. The period of time for evaporating the solvent is preferably from 1 to 120 minutes. In the case where the period is less than 1 minute, the solvent cannot be sufficiently evaporated, thereby forming bubbles upon curing. A period of time exceeding 120 minutes is not preferred since the productivity is decreased. Upon evaporating the solvent, the solvent may be dried while allowing the gas such as air, nitrogen, argon and carbon dioxide to pass through. The gas may contain an evaporated component of the solvent. The flow rate of the gas upon evaporating the solvent is preferably from 0.01 to 200 m/s. A flow rate of less than 0.01 m/s is not preferred since the evaporated component of the solvent is accumulated. A flow rate exceeding 200 m/s is not preferred since the coating composition becomes heterogeneous. The flow rate is more preferably from 0.1 to 50 m/s.

Next, a transparent sheet can be obtained by sandwiching the resin composition between smooth materials such as glass, metal and a plastic film; by curing the composition either by EB irradiation, UV irradiation or heating; and by releasing the cured composition from the substrate. In the case where the composition is not sandwiched with the smooth substrates such as glass, metal and a plastic film, the composition is cured with EB irradiation, UV irradiation or by heating in an inert gas (such as nitrogen, argon and carbon dioxide) atmosphere, followed by releasing from the substrate, to obtain a transparent sheet. Examples of the method include a method, in which the resin composition before curing having the synthetic smectite dispersed therein and containing the solvent is coated on a plane having a smooth surface, for example, a biaxially stretched polyethylene terephthalate film, in the aforementioned method, then the solvent is evaporated, sandwiched with biaxially stretched polyethylene terephthalate films having a smooth surface, and cured with EB irradiation or UV irradiation or cured by heating. The curing with EB irradiation is preferable from the standpoint of curing rate and coloration.

In the case where the resin composition is cured with EB irradiation, a polymerization initiator is not necessary. In the case where the composition is completely cured by after-curing, however, a thermal polymerization initiator may be used in combination. The electron beam acceleration voltage upon EB irradiation is from 30 to 500 kV, and preferably from 50 to 300 kV. The electron beam irradiation dose is from 1 to 1000 kGy, and preferably from 10 to 500 kGy. In the case where the electron beam acceleration voltage is less than 30 kV, shortage of the transmitted electron beam may occur when the composition has a large thickness, and in the case where it exceeds 500 kV, the operation is economically deteriorated. An electron beam irradiation dose exceeding 1000 kGy is not preferred since the substrate may be damaged.

In the case where the resin composition is cured with UV irradiation, the curing temperature is from 0 to 150° C., and preferably from 10 to 130° C. The UV irradiation time is from 0.01 to 10 hours, preferably from 0.05 to 1 hour, and further preferably from 0.1 to 0.5 hour. The UV accumulated light amount is from 10 to 5,000 mJ/cm². An accumulated light amount is less than 10 mJ/cm² is not preferred since the composition may be insufficiently cured. An accumulated light amount exceeding 5,000 mJ/cm² may decrease the productivity.

In the case where a resin composition is cured by heating, the curing temperature is from 30 to 160° C., and preferably from 40 to 130° C. In consideration of suppressing contraction or strain upon curing, a method of curing in a slow manner with a rise in temperature is preferable. The heating time is from 0.5 to 100 hours, and preferably from 3 to 50 hours.

In the case where the curing in the cured resin product is insufficient after curing by EB irradiation, UV irradiation or heating, the composition can be completely cured by after-curing. Upon performing the after-curing, the transparent sheet may be released from the smooth substrate such as glass, metal and a plastic film, or may not be released therefrom. The temperature for the after-curing is from 50 to 300° C., and preferably from 80 to 250° C. The period of time for the after-curing is from 0.1 to 10 hours, and preferably from 0.5 to 5 hours. The pressure for the after-curing may be a depressurized or pressurized atmosphere of from $1.0 \times 10^{-7}$ Pa to 1 MPa, and preferably from $1.0 \times 10^{-6}$ Pa to 0.5 MPa. The atmosphere for the after-curing may be such atmospheres as air, nitrogen, argon and carbon dioxide, and a nitrogen atmosphere is preferred from the standpoint of decreasing coloration.

In the case where a transparent sheet comprising two or more layers is produced, the sheet can be produced by a method of repeating the operation of applying (and drying) one layer on the substrate first and applying (and drying) the other layer thereon, curing the layers by EB irradiation/UV irradiation or heating, and releasing the layers from the substrate; or a method of producing two or more sheets and laminating the two or more sheets. When the two or more sheets are laminated, the interface between the two sheets may be subjected to corona treatment, anchor coating treatment and the like.

Next, in the fourth step, low-molecular-weight components such as unreacted monomer, organic quaternary ammonium salt and/or organic quaternary phosphonium salt and water contained in a cured product (transparent sheet) are removed by washing with a solvent and/or by heating.

Low-molecular-weight components such as unreacted monomer, organic quaternary ammonium salt and/or organic quaternary phosphonium salt and water are contained in a cured product. These components vaporize if a cured product containing these components is placed in vacuum at high temperature, which disturbs the treatment performed in vacuum at high temperature such as vapor deposition of a conductive thin film. Therefore the content of volatile components in the cured product needs to be reduced before such a treatment.

Examples of a method for removing volatile components in the cured product include a method of washing with a solvent and a method of removing volatile components by heating. These methods may be performed solely or in combination. Or one of the methods may be performed prior to the other one.

The method of removing volatile components with a solvent means a method in which volatile components are removed by penetrating a solvent inside the cured product from the surface thereof and releasing the volatile components, which diffuse and are eluted from the inside and surface of a solid material with a solvent, from the surface of the cured product.

The method of removing volatile components by heating means a method in which volatile components inside the cured product are diffused and reached the surface of the product by heating the product and then vaporize on the surface of the product to thereby be removed.

Examples of a solvent in the case where washing with a solvent is employed include ketones such as acetone, methyl ethyl ketone and methyl isobutyl ketone; aromatic hydrocarbons such as benzene, toluene and xylene; hydrocarbons such as hexane and cyclohexane; alcohols such as methanol, ethanol and isopropanol; halogenated hydrocarbons such as dichloromethane and trichloromethane; and esters such as ethyl acetate and butyl acetate. However, the solvent is not limited thereto. In the interest of cost and extraction properties, acetone and toluene are preferable. These solvents may be used solely or in a mixture thereof.

Examples of the form of washing in the case where washing with a solvent is employed include a method of impregnating a cured product with a solvent, a method of spraying a solvent to the surface of the cured product and a method of coagulating the solvent steam on the surface of the cured product and washing away the volatile components with a solvent.

Examples of the form of the cured product in the case where the cured product is washed with a solvent include a sheet and a film. If the cured product is too thick, it takes long time for diffusing a solvent to the depth of a cured product and for removing volatile components completely. The curable product is preferably as thin as possible for extracting volatile components in short time.

In the case where a film-shaped cured product is washed with a solvent, examples of the method include a method of allowing each piece of cut sheet of the cured product to pass through the washing process and a method of allowing a film in a roll shape to pass through the washing process continuously in a so-called roll-to-roll system. Washing a cured product in a roll-to-roll system generally enables reducing the cost per unit area of the film.

The temperature of washing with a solvent is assumed to be a temperature above the melting point of the solvent. Washing at a higher temperature will increase the diffusion rate of the solvent, which can achieve higher cleaning speed. However, if washing is conducted at a temperature of the boiling point of the solvent or higher, the washing step needs to be carried out in a pressurized vessel under pressure higher than atmospheric pressure since the solvent eventually must be liquefied on the surface of the cured product, which leads to expensive facility cost.

In the case where volatile components are washed away with a solvent, there is a possibility that a solvent remain in the cured product, and it is necessary to provide a step of drying a solvent after washing. A usual method can be used for drying such as a method of blowing hot air onto the surface of the cured product and a method of evacuating. In each case, a remaining solvent can be removed by controlling the atmosphere to a temperature and pressure such that a solvent is easily gasified.

In the case where volatile components are gasified in the air to be removed by heating a cured product, the volatile components can be gasified and removed from a cured product by heating the cured product in air, inert gas or vacuum atmosphere.

In the case where volatile components are removed by being gasified in air, a normal circulation-type drier can be used. When there is a possibility of a problem such as coloring of the cured product due to oxygen in air, the problem can be avoided by carrying out the heating treatment under an inert gas atmosphere. Examples of the inert gas include nitrogen, argon and helium, and any inert gas can be used as long as it does not adversely affect the cured product. However, it is desirable to use nitrogen from a cost viewpoint.

In the case where volatile components are removed under atmospheric pressure, high temperature is required for removing components having a high boiling point. When a cured product is raised to a significantly high temperature, it may result in adverse effects such as coloring and decomposition of resin. In this case, the heating temperature can be adjusted lower by putting the heating atmosphere in a vacuum state.

Each of the components used for the transparent composite material of the present invention is described below.

[Synthetic Smectite]

The synthetic smectite used in the invention is not particularly limited as far as it has a number average particle diameter of from 10 to 300 nm and an aspect ratio of from 10 to 300.

In the case where the transparent composite sheet made from the transparent composite material of the invention is used as a substrate for a display, it is necessary that the average particle diameter is sufficiently smaller than the wavelength of visible light. The visible light referred herein means light having a wavelength in a range of from 400 to 800 nm. Accordingly, the number average particle diameter of the synthetic smectite is preferably in a range of from 10 to 300 nm, and more preferably in a range of from 30 to 200 nm. In the case where the number average particle diameter is less than 10 nm, there is a tendency that the coefficient of thermal expansion in the plane direction of the transparent sheet is not sufficiently small, and in the case where it exceeds 300 nm, particles having a particle diameter overlapping the visible light wavelength are contained, and thus it is not preferred from the standpoint of transparency. The aspect ratio of the synthetic smectite is in a range of from 10 to 300, and more preferably in a range of from 30 to 100, from the standpoint that it is liable to be oriented in the plane direction of the transparent sheet. In the case where the synthetic smectite has an aspect ratio of less than 10, the coefficient of thermal expansion may not be in a prescribed range (preferably 30 ppm/° C. or less). In the case where synthetic smectite having an aspect ratio exceeding 300 is used, the total light transmittance of the transparent sheet may be decreased.

The number average particle diameter of the synthetic smectite referred herein means a number average particle diameter obtained by measuring the particles dispersed in a solvent by a dynamic light scattering method. The number average particle diameter by a dynamic light scattering method can be obtained, for example, by referring to "Ryushi-kei Keisoku Gijutsu" (Particle Diameter Measuring Techniques), edited by The Society of Powder Technology, Japan, 1994, pp. 169-179. Specific examples of the measuring equipment include a dynamic light scattering particle diameter distribution measuring equipment (for example, Model LB-550, produced by Horiba, Ltd.). It can be considered that the number average particle diameter of the synthetic smectite obtained by the dynamic light scattering method is substantially the same as the number average particle diameter of the synthetic smectite after dispersing in the resin in the invention.

The aspect ratio (Z) of the synthetic smectite is expressed by the relationship, $Z=L/a$. L represents the number average particle diameter in a solvent, which L is obtained by the dynamic light scattering method, and a represents the unit thickness of the synthetic smectite. The unit thickness a can be calculated by measuring diffraction peaks of a synthetic smectite by a powder X-ray diffractometry.

The synthetic smectite may be synthesized by a known method (for example, Haruo Shirozu, "Nendokobutsu-gaku, Nendo Kagaku no Kiso" (Clay Mineralogy, Basis of Clay Science), published by Asakura Publishing Co., Ltd., 1988, pp. 98-100), and commercially available synthetic smectite may be used. Examples of the synthetic smectite that are preferably used include synthetic hectorite, synthetic saponite and synthetic stevensite, and examples of the commercially available product include Synthetic Smectite SWN (synthetic hectorite), produced by Co-op Chemical Co., Ltd., Synthetic Inorganic Polymer Smecton SA (synthetic saponite), produced by Kunimine Industries Co., Ltd., Synthetic Silicate Laponite (synthetic hectorite), produced by Rockwood Specialties, Inc., and Synthetic Silicate Magnedium Salt Ionite (synthetic stevensite), produced by Mizusawa Industrial Chemicals, Ltd. More preferred examples among these include Synthetic Smectite SWN, produced by Co-op Chemical Co., Ltd. from the standpoint of transparency, cation exchange capacity and size.

In the present invention, the synthetic smectite is used which has been hydrophobized with an organic quaternary ammonium salt and/or an organic quaternary phosphonium salt, thereby having enhanced dispersibility in the resin. Examples of such chemical treatment include a method of exchanging exchangeable metallic cations such as sodium and calcium present among the flake-like crystalline layers of the synthetic smectite with various kinds of substances having cationic property such as a cationic surfactant, to insert the substances among the crystalline layers of the synthetic smectite (intercalation).

The cation exchange capacity of the synthetic smectite in this case is not particularly limited, and is preferably from 50 to 1,200 milli-equivalent per 100 g. In the case where the cation exchange capacity is less than 50 milli-equivalent per 100 g, the amount of the cationic substance intercalated among the crystalline layers of the synthetic smectite is small, and there are cases where the crystalline layers are not sufficiently made to be non-polar (hydrophobic). In the case where the cation exchange capacity exceeds 1,200 milli-equivalent per 100 g, the bonding strength among the crystalline layers of the synthetic smectite becomes too large, whereby the crystalline flakes may be difficult to be released.

The organizing method is also referred to as a cation exchanging method with a cationic surfactant, and is effective for the case where the resin component of the transparent composite material of the invention has low polarity, whereby the affinity between the synthetic smectite and the low polar resin can be improved, and the synthetic smectite can be finely dispersed in the low polar resin more uniformly.

The cationic surfactant used herein is not particularly limited, and an alkylammonium ion salt having 6 or more carbon atoms, an aromatic quaternary ammonium ion salt and a heterocyclic quaternary ammonium ion salt are preferably used since the crystalline layers of the synthetic smectite can be sufficiently made to be hydrophobic.

The examples of the organic quaternary ammonium salt include a trimethylalkylammonium salt, a triethylalkylammonium salt, a tributylalkylammonium salt, a dimethydialkylammonium salt, a dibutyldialkylammonium salt, a methylbenzyldialkylammonium salt, a dibenzyldialkylammonium salt, a trialkylmethylammonium salt, a trialkylethylammonium salt, a trialkylbutylammonium salt; a quaternary ammonium salt having an aromatic ring, such as benzylmethyl{2-

[2-(p-1,1,3,3-tetramethylbutylphenoxy)ethoxy]ethyl}ammonium chloride and the like; a quaternary ammonium salt derived from an aromatic amine, such as trimethylphenylammonium and the like; a quaternary ammonium salt having a heterocyclic ring, such as an alkylpyridinium salt, imidazolium salt and the like; a dialkyl quaternary ammonium salt having two polyethylene glycol chains, a dialkyl quaternary ammonium salt having two polypropylene glycol chains, a trialkyl quaternary ammonium salt having one polyethylene glycol chain, a trialkyl quaternary ammonium salt having one polypropylene glycol chain and the like. Among these, lauryltrimethylammonium salt, stearyltrimethylammonium salt, trioctylmethylammonium salt, distearyldimethylammonium salt, di-hydrogenated beef tallow dimethylammonium salt, distearyldibenzylammonium salt, N-polyoxyethylene-N-lauryl-N,N-dimethylammonium salt and the like are preferred. These organic quaternary ammonium salts may be used solely or in combination of two or more of them.

The examples of the organic quaternary phosphonium salt include dodecyltriphenylphosphonium salt, methyltriphenylphosphonium salt, lauryltrimethylphosphonium salt, stearyltrimethylphosphonium salt, trioctylmethylphosphonium salt, distearyldimethylphosphonium salt and distearyldibenzylphosphonium salt. These organic quaternary phosphonium salts may be used solely or in combination of two or more of them.

For enhancing the dispersibility of the synthetic smectite in resin by using the organic quaternary ammonium salt and/or organic quaternary phosphonium salt with resin, aliphatic quaternary ammonium salt and/or quaternary phosphonium salt are preferably used, and a trialkylmethylammonium salt and a trialkyl quaternary ammonium salt having one polypropylene glycol chain are particularly preferred.

Furthermore, a surface modification agent may be used for dispersing the synthetic smectite highly in resin. Generally, an aliphatic surface modification agent is preferably used for a resin having a high content of aliphatic carbon chains.

The synthetic smectite used in the invention may be subjected to the organizing treatment not only among the layers but also on the surface thereof. The surface of the synthetic smectite has a functional group such as a hydroxyl group, and therefore, can be organized with a compound having a functional group having reactivity with the terminal hydroxyl group. The compound having a functional group capable of being chemically bonded to the hydroxyl group (surface modification agent) is not particularly limited, and examples thereof include compounds having the functional group such as a silane compound (silane coupling agent), a titanate compound (titanate coupling agent), a glycidyl compound and an isocyanate compound. These compounds may be used solely or in combination of two or more of them.

Among the compounds, a silane compound is preferably used. Specific examples of the silane compound include vinyltrimethoxysilane, vinyltriethoxysilane, γ-aminopropyltrimethoxysilane, γ-aminopropylmethyldimethoxysilane, γ-aminopropyldimethylmethoxysilane, γ-aminopropyltriethoxysilane, γ-aminopropylmethyldiethoxysilane, γ-aminopropyldimethylethoxysilane, methyltriethoxysilane, dimethyldimethoxysilane, trimethylmethoxysilane, hexyltrimethoxysilane, hexyltriethoxysilane, octadecyltrimethoxysilane, octadecyltriethoxysilane, γ-methacryloxypropylmethyldimethoxysilane, γ-methacryloxypropylmethyldiethoxysilane, γ-methacryloxypropyltrimethoxysilane and γ-methacryloxypropyltriethoxysilane. These silane compounds may be used solely or in combination of two or more of them.

The content of the synthetic smectite in the transparent composite material is preferably in a range of from 10 to 40% by mass, and more preferably in a range of from 15 to 30% by mass. In the case where the content of the synthetic smectite is less than 10% by mass, the average coefficient of thermal expansion of the transparent composite material at from 50 to 250° C. becomes larger than 30 ppm/° C. In the case where the content of the synthetic smectite exceeds 40% by mass, it becomes difficult to disperse the synthetic smectite uniformly in the resin, and the mechanical strength of the transparent composite material is decreased to be brittle and fragile.

[Resin Composition]

For the resin composition of the present invention, a conventional curable resin composition such as a thermosetting resin composition and a photo-curable resin composition can be used as long as the cured product thereof containing synthetic smectite (after the three-dimensional crosslinking reaction) is transparent. Specific example of the resin composition include a composition containing allyl ester resin, vinyl ester resin, crosslinked acrylic resin (having polyfunctional group), epoxy resin, thermosetting modified polyphenylene ether resin, thermosetting polyimide resin, silicone resin, benzoxadine resin, melamine resin, urea resin, phenol resin, bismaleimide triazine resin, alkyd resin, furan resin, polyurethane resin, aniline resin and the like. Among these, preferred is a composition containing radically reactive three-dimensionally crosslinked resin such as allyl ester resin and vinyl ester resin, wherein crosslinking reaction proceeds by radical polymerization. Further, as a component other than the above curable resin, the resin composition may contain reactive monomer, curing agent, additives, other radically reactive resin components and the like as described below.

(i) Resin Composition Containing Allyl Ester Resin

The allyl ester resin composition of the present invention contains a compound having allyl group or methallyl group (hereinafter, both sometimes referred to as "(meth)allyl group") and an ester structure.

The compound having (meth)allyl group and an etser structure can be obtained through (1) esterification reaction between a compound having (meth)allyl group and hydroxy group (here, collectively referred to as "allyl alcohol") and a compound having carboxyl group, (2) esterification reaction between a compound having (meth)allyl group and carboxyl group and a compound having hydroxyl group, or (3) ester exchange reaction between an ester compound obtained from allyl alcohol and dicarboxylic acid and a polyvalent alcohol.

In a case where the compound having a carboxyl compound in (1) and (2) is a polyester oligomer of dicarboxylic acid and a diol, the compound may have allyl alcohol ester only at terminus. Examples of an ester compound obtained from allyl alcohol and dicarboxylic acid in (3) include at least one kind of compound selected from the compounds represented by formula (1).

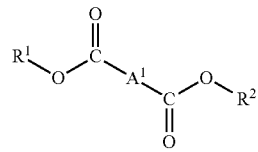

(1)

In the formula, $R^1$ and $R^2$ independently represent either of allyl group or methallyl group, $A^1$ represents an organic residue which is derived from dicarboxylic acid and has at least one structure from an alicyclic structure, aromatic ring structure and aliphatic chain structure. The compound may be contained in the allyl ester resin composition of the present invention as a reactive diluent (reactive monomer) as well as may become a raw material of allyl ester oligomer described later. $A^1$ in formula (1) is preferably the same with $A^2$ and $A^3$ in formulae (2) and (3) described later.

It is preferred that the compound having (meth)allyl group and an ester structure be an allyl ester compound having an ester structure formed of polyvalent alcohol and dicarboxylic acid, having allyl group and/or methallyl group as terminus (hereinafter, the compound is sometimes referred to as "allyl ester oligomer").

It is preferred that the allyl ester oligomer be a compound having a group represented by formula (2) as terminus, and having a structure represented by formula (3) as constituent unit.

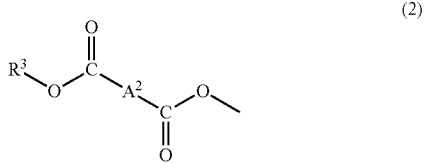

(2)

In the formula, $R^3$ represents allyl group or methallyl group, $A^2$ represents an organic residue which is derived from dicarboxylic acid and has at least one structure from an alicyclic structure, aromatic ring structure and aliphatic chain structure.

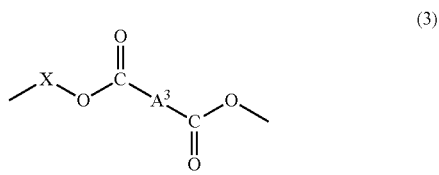

(3)

In the formula, $A^3$ represents an organic residue which is derived from dicarboxylic acid and has at least one structure from an alicyclic structure, aromatic ring structure and aliphatic chain structure, X represents an organic residue derived from polyvalent alcohol, with a proviso that X may have a branched structure through ester bonds, having a group represented by formula (2) as terminus and a group represented by formula (3) as constituent unit.

In the allyl ester oligomer, there are at least two terminuses represented by formula (2), but in a case where X in formula (3) has a branched structure, there are three or more terminuses. In this case, there exist multiple $R^3$'s for each of the terminuses. These $R^3$'s need not be of the same kind and the structure of one terminus may include allyl group while that of another terminus may include methallyl group. Moreover, all the $R^3$'s do not necessarily have to be allyl group or methallyl group. To an extent that does not impair curability, some of the $R^3$'s may be a non-polymerizable group such as methyl group and ethyl group.

Similarly, with respect to the structure represented by $A^2$, the terminuses may be different from each other. For example, the structure of $A^2$ at one terminus may include a benzene ring while $A^2$ at another terminus may include a cyclohexane ring. $A^2$ in formula (2) is an organic residue derived from dicarboxylic acid and having at least one structure among an alicyclic structure, an aromatic ring structure or an aliphatic chain structure. The portion derived from dicarboxylic acid is shown as a carbonyl structure adjacent to $A^2$. Therefore, $A^2$ shows a benzene skeleton or a cyclohexane skeleton. In the interest of transparency, dicarboxylic acid having an alicyclic structure or an aliphatic chain structure is preferable to carboxylic acid having an aromatic ring structure.

Although there is no particular limitation on dicarboxylic acid from which $A^2$ is derived from, terephthalic acid, isophthalic acid, phthalic acid, 1,4-cyclohexane dicarboxylic acid, 1,4-naphthalene dicarboxylic acid, 1,5-naphthalene dicarboxylic acid, 2,7-naphthalene dicarboxylic acid, diphenyl-m,m'-dicarboxylic acid, diphenyl-p,p'-dicarboxylic acid, benzophenone-4,4'-dicarboxylic acid, p-phenylene diacetate, p-carboxyphenyl acetate, methylterephthalic acid, tetrachlorophthalic acid, malonic acid, succinic acid, glutaric acid, adipic acid, 2-methylsuccinic acid, maleic acid, fumaric acid, itaconic acid, citraconic acid and endic anhydride. Among these dicarboxylic acids, preferred is dicarboxylic acid having an aliphatic chain structure or an alicyclic structure including malonic acid, succinic acid, glutaric acid, adipic acid, 2-methylsuccinic acid and 1,4-cyclohexanedicarboxylic acid. Dicarboxylic acid having an alicyclic structure is more preferable and examples thereof include 1,4-cyclohexanedicarboxylic acid.

As dicarboxylic acid from which $A^2$ is derived from, when the one having an alicyclic structure such as 1,4-cyclohexanedicarboxylic acid is used, a flexible molded product can be obtained which can be easily made into a transparent film and the like. Also, by using dicarboxylic acid having an alicyclic structure which enables good dispersion of a tabular inorganic substance in resin, a film having excellent transparency and less coloring can be obtained compared to the case using aromatic dicarboxylic acid.

At least one constituent unit represented by above-described formula (3) is required in allyl ester oligomer. It is preferred that the molecular weight of the whole allyl ester oligomer be increased to a certain level by repetition of this unit, so that appropriate viscosity may be obtained, enhancing workability and toughness of cured product. However, if the molecular weight is too high, the molecular weight between the cross-link points becomes too high, which results in lowering the glass transition temperature (Tg) and may deteriorate the heat resistance. Therefore, it is important to adjust the molecular weight appropriately for purposes.

The allyl ester resin composition contains a synthetic smectite having a number average particle diameter of from 10 to 300 nm and an aspect ratio of from 10 to 300. By containing the laminated inorganic compound, the resin composition enables improving the glass transition (Tg) temperature and the linear expansion coefficient while maintaining the transparency. However, the cured product tends to be fragile when the allyl ester oligomer has a low molecular weight. Accordingly, it is preferable to adjust the molecular weight of the allyl ester oligomer slightly high in the allyl ester resin composition of the present invention. The weight average molecular weight is preferably 500 to 100,000, more preferably 1,000 to 50,000.

The skeleton of the oligomer can be selected with no particular limitations. When a linear oligomer having a high molecular weight is used, the obtained resin tends to be relatively flexible and have high toughness. When a branched oligomer is selected, it is possible to obtain a resin having high hardness and high heat resistance. It is also possible to control the flexibility and hardness appropriately by mixing both of the oligomers.

$A^3$ in formula (3) is an organic residue which is derived from dicarboxylic acid and has at least one structure from an alicyclic structure, aromatic ring structure and aliphatic chain structure, and its definition and preferred examples of the compound are the same as in $A^2$ in formula (2). X in formula (3) represents an organic residue derived from polyvalent alcohol. Polyvalent alcohol is a compound having two or more hydroxyl groups, and preferably two hydroxyl groups, and X itself represents the skeleton portion except for hydroxyl groups. Further, in the polyvalent alcohol, since at least two hydroxyl groups have to be bonded, some hydroxyl groups may remain unreacted when the polyvalent alcohol has a valence of three or more. i.e. it has three or more hydroxyl groups.

Examples of polyvalent alcohol include ethylene glycol, propylene glycol, 1,3-propane diol, 1,4-butane diol, 1,3-butane diol, 1,5-pentane diol, neopentyl glycol, 1,6-hexane diol, 1,4-cyclohexane dimethanol, diethylene glycol, ethylene oxide adduct of isocyanuric acid, pentaerythritol, tricyclodecanedimethanol, glycerine, trimethylol propane, ethylene oxide adduct of pentaerythritol, D-sorbitol and hydrogenated bisphenol-A.

With respect to the constituent unit represented by formula (3) in the allyl ester oligomer, one type of the constituent unit may be repeated or different types of the unit may be included. That is, the allyl ester oligomer may be a copolymer type. In this case, in one allyl ester oligomer, several kinds of X exist. For example, the structure may include a residue derived from propylene glycol as one X and another residue derived from trimethylol propane as another X. In this case, allyl ester oligomer has branches at trimethylol propane residue. Two or more types of $A^3$ may exist as well. A structural formula (4), an example in a case where $R^3$ is allyl group, $A^2$ and $A^3$ are residues derived from isophthalic acid, X is propylene glycol or trimethylol propane, is shown below.

opening reaction of a compound having a carboxyl group and an epoxy group of a polymerizable unsaturated compound having an epoxy group in the molecule thereof, such as glycidyl (meth)acrylate. Details thereof are disclosed in "Polyester Jushi Handbook" (Polyester Resin Handbook), published by Nikkan Kogyo Shimbun, Ltd., 1988, pp. 336-357, and the like. The vinyl ester resin can be produced by a known method.

Though the vinyl ester resin is not particularly limited, when a synthetic smectite is used, it is preferably a vinyl ester resin synthesized from an aliphatic epoxy compound, and more preferably, a vinyl ester resin synthesized from an epoxy compound having an alicyclic structure. Examples of the alicyclic epoxy compound include a hydrogenated bisphenol A epoxy resin, a cyclohexane type compound such as diglycidyl 1,2-cyclohexanedicarboxylate, 3,4-epoxycyclohexenylmethyl-3',4'-epoxycyclohexene carboxylate and bis(3,4-epoxy-6-methylcyclohexylmethyl) adipate; a norbornene type compound such as 3-oxatricyclo[3.2.1.02,4] octane-6-carboxylic acid and 3-oxatricyclo[3.2.1.02,4]oct-6-yl methyl ester; an adamantane type compound such as 7-oxabicyclo[4.1.0]heptane-3-carboxylic acid and tricyclo [3.3.1.13,7]decan-1,3-diyl ester. Among these, a hydrogenated bisphenol A epoxy resin is more preferred from the standpoint of transparency, toughness and heat resistance. A resin having a molecular weight of 800 or more can further improve the toughness. Even in the case where an epoxy resin as a raw material has an average molecular weight of less than 500, the molecular weight may be increased by using partly such dicarboxylic acids such as succinic acid, adipic acid, dodecanedicarboxylic acid and 1,4-cyclohexanedicarboxylic acid.

Upon producing the vinyl ester resin, the reaction is performed by charging the above-mentioned epoxy compound and the ethylenic unsaturated compound having a carboxyl

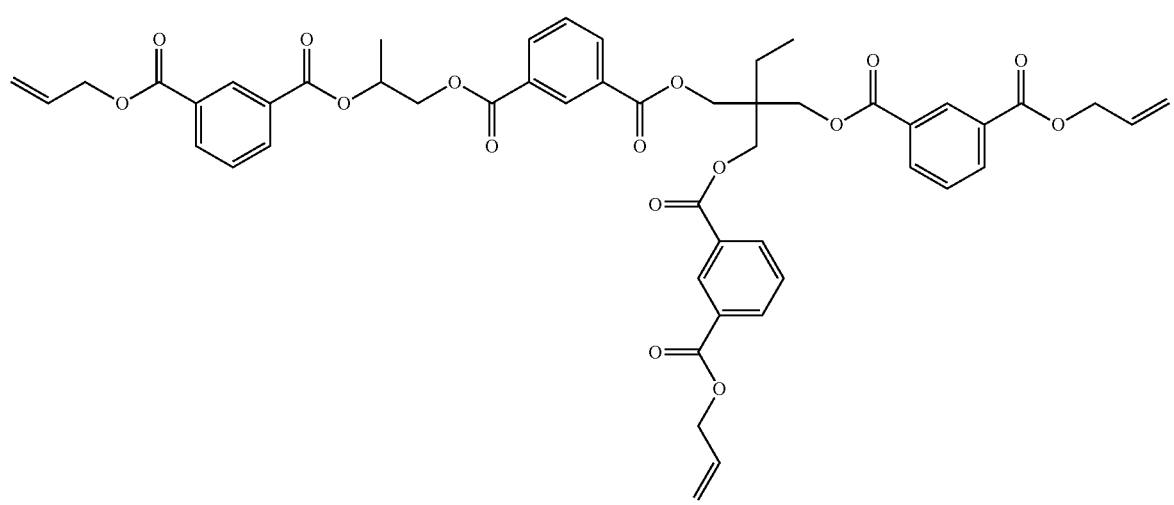

(4)

(ii) Resin Composition Containing Vinyl Ester Resin

The vinyl ester resin is also referred to as epoxy (meth) acrylate, and generally means (1) a resin having an ethylenic unsaturated group, synthesized by ring-opening reaction of an epoxy compound, represented by an epoxy resin, and a carboxyl group of a carboxyl compound having a radical polymerizable carbon-carbon double bond (ethylenic unsaturated group) such as (meth)acrylic acid, or (2) a resin having a polymerizable unsaturated group, synthesized by ring-group in a reactor, into which air is blown. The reaction temperature is preferably from 70 to 150° C., and more preferably from 80 to 140° C. In the case where the reaction temperature is less than 70° C., it is not economical since the reaction time is prolonged. In the case where the reaction temperature exceeds 150° C., the system is gelled in many cases.

A reaction catalyst may not be added, but it is economical when the catalyst is added since the reaction time is shortened. Preferred examples of the catalyst include a tertiary amine compound, a phosphine compound and an onium salt. Specific examples of the tertiary amine compound include dimethylcyclohexylamine, N,N-dimethylpiperazine and benzyldimethylamine; and examples of the phosphine compound include triphenylphosphine, tritolylphosphine and tricyclohexylphosphine. Examples of the onium salt include a quaternary ammonium salt and a quaternary phosphonium salt; examples of the quaternary ammonium salt include tetramethylammonium chloride, tetrabutylammonium chloride, tetramethylammonium bromide, tetrabutylammonium bromide and decyltrimethylammonium chloride; and examples of the quaternary phosphonium salt include tetraphenylphosphonium chloride, benzyltriphenylphosphonium chloride, tetraphenylphosphonium bromide and tetramethylphosphonium tetraphenylborate. The addition amount of the catalyst is preferably from 0.05 to 3 parts by mass, and more preferably from 0.1 to 2 parts by mass, per 100 parts by mass in total of the epoxy resin and the ethylenic unsaturated compound having a carboxyl group. An amount of the catalyst less than 0.05 part by mass is not preferred since no effect of accelerating the reaction is exhibited, and an amount of the catalyst exceeding 3 parts by mass is not preferred since the resin is significantly colored.

These curable resins may be used solely or in combination of two or more thereof.

However, a curable resin which does not have an aromatic ring structure is preferable in terms of providing good compatibility with synthetic smectite and obtaining higher transparency.

Generally, the term "curable resin" indicates both of resin in a prepolymer state before curing (containing oligomer, additives and monomers) and the cured product thereof. In the present specification, the term "resin composition" means resin in a prepolymer state before curing.

The resin composition prepared in the second step of the present invention comprises resin which contains an oligomer components having at least two radically reactive functional groups such as vinyl group and allyl group (here, the "resin" indicates a resin component before curing, which may also be referred to as prepolymer or oligomer. A monomer component may be contained in the resin.) and synthetic smectite having a number average particle diameter of from 10 to 300 nm and an aspect ratio of from 10 to 300. The composition may further contain a reactive diluent (reactive monomer), a curing agent (radical polymerization initiator) and various additives as needed. Also, at the stage of a resin composition, it may contain a solvent which does not contribute to the crosslinking reaction for the purpose of lowering the viscosity to improve the workability but the solvent needs to be removed eventually.

[Reactive Monomer]

In the resin composition of the invention, a reactive monomer may be added for such purposes as control of the curing rate, adjustment of the viscosity (improvement of workability), enhancement of the crosslinking density and addition of functionalities. The reactive monomer is not particularly limited, and various kinds thereof may be used, and a monomer having a radical polymerizable carbon-carbon double bond (ethylenic unsaturated group) such as a vinyl group and an allyl group is preferred for reacting with the three-dimensionally crosslinked resin composition. Examples of the monomer include a monofunctional monomer having one ethylenic unsaturated group in one molecule and a polyfunctional monomer having two or more ethylenic unsaturated groups in one molecule. Preferred specific examples of the reactive monomer are described below. The term (meth)acrylate indicates acrylate and methacrylate.

Examples of the monofunctional monomer include an aliphatic (meth)acrylate, such as methyl (meth)acrylate, ethyl (meth)acrylate, n-butyl (meth)acrylate, sec-butyl (meth)acrylate, t-butyl (meth)acrylate, 2-ethylhexyl (meth)acrylate, octyl (meth)acrylate, dodecyl (meth)acrylate, octadecyl (meth)acrylate, isobornyl (meth)acrylate, cyclohexyl (meth) acrylate, methylcyclohexyl (meth)acrylate, 4-t-butylcyclohexyl (meth)acrylate, dicyclopentenyloxymethyl (meth) acrylate, dicyclopentenyloxyethyl (meth)acrylate, ethoxyethyl (meth)acrylate, ethoxydiethylene glycol (meth) acrylate, 2-hydroxyethyl (meth)acrylate and 2-hydroxypropyl (meth)acrylate; an aromatic (meth)acrylate, such as benzyl (meth)acrylate, phenyl (meth)acrylate, phenoxyethyl (meth)acrylate, phenoxydiethylene glycol (meth)acrylate, 1-naphthyl (meth)acrylate, fluorophenyl (meth)acrylate, chlorophenyl (meth)acrylate, cyanophenyl (meth)acrylate, methoxyphenyl (meth)acrylate and biphenyl (meth)acrylate; a haloalkyl (meth)acrylate such as fluoromethyl (meth)acrylate and chloromethyl (meth)acrylate; a (meth)acrylate compound such as glycidyl (meth)acrylate, alkylamino (meth) acrylate and cyanoacrylate ester; a nitrogen-containing monomer such as acrylamide, N,N-dimethylacrylamide, N,N-diehylacrylamide, N-vinylformamide, N-vinylacetamide, N-vinyl-ε-caprolactam, N-vinylpyrrolidone, 1-vinylimidazole, N-vinylcarbazole, N-vinylmorpholine, N-vinylpyridine and acryloylmorpholine; styrene, α-methylstyrene, chlorostyrene, styrenesulfonic acid, 4-hydroxystyrene, vinyltoluene, vinyl acetate, vinyl propionate, vinyl benzoate and the like.

Examples of the polyfunctional monomer include a di(meth)acrylate compound such as ethylene glycol di(meth) acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, neopentyl glycol di(meth)acrylate, 1,9-nonanediol di(meth) acrylate, 1,10-decanediol di(meth)acrylate, dimethyloltricyclodecane di(meth)acrylate, polybutadiene di(meth)acrylate, 2,2-bis(4-(meth)acryloyloxyphenyl)propane, 2,2-bis(4-(O)-(meth)acryloyloxypolyethoxy)phenyl)propane, and di(meth) acrylate of an ethylene oxide adduct of bisphenol A; a trifunctional crosslinking monomer such as trimethylolethane tri (meth)acrylate, trimethylolpropane tri(meth)acrylate, triacrylate of an ethylene oxide adduct of trimethylolpropane and pentaerythritol tri(meth)acrylate; a tetrafunctional or higher polyfunctional acrylate such as pentaerythritol tetra (meth)acrylate, tetra(meth)acrylate of an ethylene oxide adduct of pentaerythritol and dipentaerythritol hexa(meth) acrylate; an aromatic diallyl carboxylate compound such as diallyl phthalate, diallyl isophthalate, dimethallyl isophthalate, diallyl terephthalate, triallyl trimellitate, diallyl 2,6-naphthalenedicarboxylate, diallyl 1,5-naphthalanedicarboxylate, allyl 1,4-xylenedicarboxylate and diallyl 4,4'-diphenyldicarboxylate; and an allyl compound such as diallyl cyclohexanedicarboxylate, tri(meth)allyl isocyanurate, tri (meth)allyl cyanurate and diallyl chlorendate.

The reactive monomers may be used solely or in combination of two or more of them. The amount of the reactive monomer used is not particularly limited, and from 0 to 70% by mass of the reactive monomer is preferably used with from 30 to 100% by mass of the resin. An amount of the reactive monomer used exceeding 70% by mass is not preferred since the excellent transparency of the resin may not be exhibited, and the mechanical strength inherent to the resin may be decreased.

[Curing Agent]

Upon curing the resin composition of the invention, electron beam (EB) curing is preferably employed, and ultraviolet ray (UV) curing and thermal curing may also be employed. In the case where the composition is cured by UV irradiation or thermal curing, a curing agent may be used. The curing agent that can be used is not particularly limited, and those that are ordinarily used as a curing agent for a polymerizable resin may be used. Among these, a radical polymerization initiator is preferably added from the standpoint of polymerization initiation of a (meth)acryloyloxy group. Examples of the radical polymerization initiator include a photopolymerization initiator, an organic peroxide and an azo compound. For UV-curing the three-dimensionally crosslinked resin composition of the invention, a photopolymerization initiator is particularly preferred.

Examples of the photopolymerization initiator include 2,2-dimethoxy-1,2-diphenylethan-1-one, 1-hydroxycyclohexyl phenyl ketone, benzophenone, 2-methyl-1-(4-methylthiophenyl)-2-morpholinopropan-1-one, 2-benzyl-2-dimethylamino-1-(4-morpholinophenyl)butanone-1,2-hydroxy-2-methyl-1-phenylpropan-1-one, 1-[4-(2-hydroxyethoxy)phenyl]-2-hydroxy-2-one, 2-hydroxy-1-{4-[4-(2-hydroxy-2-methylpropyonyl)benzyl]-phenyl}-2-methylpropan-1-one, oxyphenylacetic acid 2-[2-oxo-2-phenylacetoxyethoxy]ethyl ester, oxyphenylacetic acid 2-[2-hydroxyethoxy]ethyl ester, phenylglyoxylic acid methyl ester, 2-dimethylamino-2-(4-methylbenzyl)-1-(4-morpholin-4-ylphenyl)butan-1-one, bis(2,4,6-trimethylbenzoyl)phenylphosphine oxide, 1,2-octadione, 1-[4-(phenylthio)phenyl-2-(O-benzoyloxime)], ethanone, 1-[9-ethyl-6-(2-methylbenzoyl)-9H-carbazol-3-yl]-1-(O-acetyloxime), iodonium (4-methylphenyl)[4-(2-methylpropyl)phenyl]hexafluorophosphate(1-), ethyl-4-dimethylaminobenzoate, 2-ethylhexyl-4-dimethylaminobenzoate and 2,4,6-trimethylbenzoyldiphenylphosphine oxide.

As the organic peroxide, known ones may be used, such as a dialkyl peroxide, an acyl peroxide, a hydroperoxide, a ketone peroxide and a peroxyester. Specific examples thereof include diisobutyryl peroxide, cumyl peroxyneodecanoate, di-n-propyl peroxydicarbonate, diisopropyl peroxydicarbonate, di-sec-butyl peroxydicarbonate, 1,1,3,3-tetramethylbutyl peroxyneodecanoate, di(4-t-butylcyclohexyl) peroxydicarbonate, di(2-ethylhexyl) peroxidicarbonate, t-hexyl peroxyneodecanoate, t-butyl peroxyneodecanoate, t-butyl peroxyneoheptanoate, t-hexyl peroxypivalate, t-butyl peroxypivalate, di(3,5,5-trimethylhexanoyl) peroxide, dilauroyl peroxide, 1,1,3,3-tetramethylbutyl peroxy-2-ethylhexanoate, disuccinic acid peroxide, 2,5-dimethyl-2,5-di(2-ethylhexanoylperoxy)hexane, t-hexyl peroxy-2-ethylhexanoate, di(4-methylbenzoyl) peroxide, t-butyl peroxy-2-ethylhexanoate, di(3-methylbenzoyl) peroxide, benzoyl(3-methylbenzoyl) peroxide, dibenzoyl peroxide, 1,1-di(t-butylperoxy)-2-methylcyclohexane, 1,1-di(t-hexylperoxy)-3,3,5-trimethylcyclohexane, 1,1-di(t-butylperoxy)cyclohexane, 2,2-bis[4,4-di(t-butylperoxy)cyclohexyl]propane, t-hexylperoxyisopropyl monocarbonate, t-butylperoxymaleic acid, t-butyl peroxy-3,5,5-trimethylhexanoate, t-butyl peroxylaurate, t-butylperoxyisopropyl monocarbonate, t-butylperoxy-2-ethylhexyl monocarbonate, t-hexyl peroxybenzoate, 2,5-dimethyl-2,5-di(benzoylperoxy)hexane, t-butyl peroxyacetate, 2,2-di(t-butylperoxy)butane, t-butyl peroxybenzoate, n-butyl-4,4-di(t-butylperoxy) valerate, di(t-butylperoxyisopropyl)benzene, dicumyl peroxide, di(t-hexyl) peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, 1,1,3,3-tetramethylbutyl hydroperoxide, cumene hydroperoxide and t-butyl hydroperoxide.

Examples of the azo compound include 2,2'-azobis(4-methoxy-2,4-dimethylvaleronitrile, 2,2'-azobis(2,4-dimethylvaleronitrile), dimethyl 2,2'-azobis(2-methylpropionate), 2,2'-azobis(2-methylbutyronitrile), 1,1'-azobis(cyclohexane-1-carbonitrile), 2,2'-azobis[N-(2-propenyl)-2-methylpropionamide], 1-[(1-cyano-1-methylethyl)azo]formamide, 2,2'-azobis(N-butyl-2-methylpropionamide) and 2,2'-azobis(N-cyclohexyl-2-methylpropionamide).

The radical polymerization initiators may be used solely or in combination of two or more of them. The amount of the curing agent mixed is not particularly limited, and is preferably from 0.1 to 10 parts by mass, and more preferably from 0.5 to 5 parts by mass, per 100 parts by mass of the three-dimensionally crosslinked resin composition. In the case where the amount of the curing agent mixed is less than 0.1 part by mass, a sufficient curing rate may not be obtained, and in the case where the amount exceeds 10 parts by mass, there are cases where the final cured product become brittle to decrease the mechanical strength thereof.

[Additive]

To the resin composition of the invention, various additives such as an antioxidant, a lubricant and an ultraviolet ray absorbent may be added depending on necessity.

The antioxidant is not particularly limited, and products that are ordinarily used may be used. Among these, a phenol antioxidant, an amine antioxidant, a sulfur antioxidant, a phosphorus antioxidant and the like are preferred, and a phenol antioxidant and an amine antioxidant being radical chain inhibitors are more preferred, and a phenol antioxidant is particularly preferred. Examples of the phenol antioxidant include 2,6-di-t-butyl-p-cresol, 4,4-butylidenebis(6-t-butyl-3-methylphenol), 2,2'-methylenebis(4-methyl-6-t-butylphenol), 2,2'-methylenebis(4-ethyl-6-t-butylphenol), 2,6-di-t-butyl-4-ethylphenol, 1,1,3-tris(2-methyl-4-hydroxy-5-t-butylphenyl)butane, n-octadecyl-3-(3,5-di-t-butyl-4-hydroxyphenyl) propionate, tetrakis(methylene-3-(3,5-di-t-butyl-4-hydroxyphenyl) propionate)methane, triethylene glycol bis[3-(3-t-butyl-4-hydroxy-5-methylphenyl) propionate], tris(3,5-di-t-butyl-4-hydroxybenzyl) isocyanurate, 4,4-thiobis(6-t-butyl-3-methylphenol), 3,9-bis[2-[3-(3-t-butyl-4-hydroxy-5-methylphenyl)]-propionyloxy]-1,1'-dimethylethyl]-2,4,8,10-tetraoxa-spiro[5.5]undecane, thiodiethylenebis[3-(3,5-di-t-butyl-4-hydroxyphenyl) propionate], N,N'-hexan-1,6-diylbis[3-(3,5-di-t-butyl-4-hydroxyphenyl)-propionamide] and the like. Examples of the amino antioxidant include alkyldiphenylamine, N,N'-di-sec-butyl-p-phenylenediamine, N-phenyl-N'-1,3-dimethlbutyl-p-phenylenediamine, dialkylhydroxylamine and the like. Examples of the sulfur antioxidant include dilauryl-3,3'-thiodipropionate, ditridecyl-3,3'-thiodipropionate, dimyristyl-3,3'-thiodipropionate, distearyl-3,3'-thiodipropionate, pentaerythrityltetrakis(3-laurylthiopropionate) and the like. Examples of the phosphorus antioxidant include tris[2-[[2,4,8,10-tetra-t-butylbenzo[d,f][1,3,2]dioxa-phosphephin-6-yl]oxy]ethyl]amine, bis[2,4-bis(1,1-dimethylethyl)-6-methylphenyl]ethyl ester phosphite and tetrakis(2,4-di-t-butylphenyl)[1,1-biphenyl]-4,4'-diyl bisphonate. The antioxidants may be used solely or in combination of two or more of them.

The lubricant is not particularly limited, and products that are ordinarily used may be used. Among these, a metallic soap lubricant, a fatty acid ester lubricant, an aliphatic hydrocarbon lubricant and the like are preferred, and a metallic soap lubricant is particularly preferred. Examples of the metallic soap lubricant include barium stearate, calcium stearate, zinc stearate, magnesium stearate and aluminum stearate. These may be used as a composite.

The ultraviolet ray absorbent is not particularly limited, and products that are ordinarily used may be used. Among these, a benzophenone ultraviolet ray absorbent, a benzotriazole ultraviolet ray absorbent and a cyanoacrylate ultraviolet ray absorbent are preferred, and a benzophenone ultraviolet ray absorbent is particularly preferred. Examples of the benzophenone ultraviolet ray absorbent include 2-(2'-hydroxy-5'-methyphenyl)benzotriazole, 2-(2'-hydroxy-5'-butylphenyl)benzotriazole and 2-(2-hydroxy-3'-t-butylphenyl) benzotriazole.

The additives are not limited to the aforementioned specific examples and, as the other additives, a defoaming agent, leveling agent, a releasing agent, a water repellent, a flame retarder, a contraction preventing agent and a crosslinking assistant and the like may be used for improving hardness, strength, moldability, durability and water resistance unless the objects and advantages of the invention are impaired.

[Solvent]

In the invention, a solvent is preferably used for effectively releasing the layers of the synthetic smectite for dispersing in the resin composition. Examples of the solvent include an aromatic hydrocarbon compound such as benzene, toluene, xylene, ethylbenzene, mesitylene, n-propylbenzene and isopropylbenzene; an acetate ester compound such as methyl acetate, ethyl acetate, propyl acetate and butyl acetate; a ketone compound such as acetone, methyl ethyl ketone and methyl isobutyl ketone; an ether compound such as diethyl ether, tetrahydrofuran and 1,4-dioxane; an alcohol compound such as methanol, ethanol, (iso)propanol and butyl alcohol; a halogenated hydrocarbon compound such as chloroform and methylene chloride; a nitrogen-containing solvent such as N,N-dimethylformamide, N-methylpyrrolidone, pyridine and acetonitrile; and the like. Preferred examples thereof include water, an alcohol compound such as methanol, toluene, xylene and N-methylpyrrolidone.

The proportion of the solvent to the synthetic smectite varies largely depending on the kind of the solvent, and is from 100 to 10,000 parts by mass, and more preferably from 200 to 5,000 parts by mass, per 100 parts by mass of the synthetic smectite. In the case where the proportion of the solvent is less than 100 parts by mass, the viscosity of the mixture liquid is increased to make it difficult to mix uniformly.

EXAMPLES

The invention will be described with reference to Synthesis Examples, Example and Comparative Examples below, but the invention is not limited to the description.

[Measurement of Coefficient of Thermal Expansion and Tg]

The coefficient of thermal expansion was measured with TMA/SS6100, produced by SII NanoTechnology Inc., in a tensile mode. A test piece in a film form had a thickness of 100 μm×3 mm×12 mm (chuck distance: 10 mm) and was applied with a tension of 0.001 kgf, the temperature of which was increased to 250° C. at a temperature increasing rate of 5° C. per minute in an atmosphere containing 100 mL/min of nitrogen and then decreased to 50° C., and the elongation rate of the test piece was measured by again increasing the temperature from 50° C. to 250° C. at a temperature increasing rate of 5° C. per minute. The average coefficient of thermal expansion in the plane direction within a range of from 50 to 250° C. was calculated from the difference in elongation between 50° C. and 250° C. and the temperature difference (200° C.). The temperature of the discontinuous point in elongation rate was designated as the glass transition temperature (Tg).

[Total Light Transmittance]

The total light transmittance was measured with an automatic haze meter, TC-H3DPK, produced by Tokyo Denshoku Co., Ltd., according to JIS K7361-1.

[Haze]

The haze value was measured with an automatic haze meter, TC-H3DPK, produced by Tokyo Denshoku Co., Ltd., according to JIS K7136.

Synthesis Example 1

Vinyl Ester Resin 276.3 parts (parts by mass, hereinafter the same) of a hydrogenated bisphenol A epoxy resin ST-4000D (a trade name, epoxy equivalent: 725), produced by Tohto Kasei Co., Ltd., 202.5 parts of toluene and 0.19 part of 4-methoxyphenol (MEHQ: hydroquinone monomethyl ether) as a polymerization inhibitor were charged in a four-neck flask equipped with a thermostat, a stirrer, a Dimroth condenser and an air introducing tube, and the temperature was increased to 80° C. while dry air was blown (20 ml/min), followed by stirring until the mixture became homogeneous. After the mixture was homogeneous, 27.5 parts of acrylic acid, produced by Kuraray Co., Ltd., and 1.24 parts of benzyltriphenylphosphonium chloride (TPP-ZC, a trade name, produced by Hokko Chemical Industry Co., Ltd.) as a catalyst were added and reacted at a temperature controlled to 110° C. for 7 hours. The reaction was terminated at an acid value of 7.8 mgKOH/g to obtain an oligomer (1) (toluene solution).

Example 1

585 g of toluene was placed in a 1-liter polyethylene bottle, to which 65 g of oleophilic synthetic smectite (Smectite STN, produced by Co-op Chemical Co., Ltd., number average particle diameter: 50 nm, aspect ratio: 50, inorganic content: 71%) having been subjected to a cation exchanging treatment with trioctylmethylammonium salt was added little by little under stirring with a stirrer. After closing the bottle with a lid, the mixture was stirred with Mixrotor at room temperature for one day to obtain a smectite dispersion liquid. A toluene solution of the oligomer (1) (102.5 g in terms of resin amount) was added to the smectite dispersion liquid, and 18.9 g of methoxy polyethylene glycol #400 acrylate manufactured by Shin-Nakamura Chemical Co., Ltd. (trade name: AM-90G) was added, followed by sufficiently stirring, to obtain a composition (1). The composition (1) was attached to an evaporator and stirred at room temperature under 20 kPa for 10 minutes for controlling the viscosity and removing the gaseous components in the composition.

The composition (1) was applied on a PET film (thickness: 50 μm) with a bar coater to a dry thickness of 100 μm. The composition was dried with a hot air dryer at 80° C. for 30 minutes to evaporate toluene as a solvent, and then covered from above with a PET film (thickness: 50 μm). The composition was cured by EB irradiation with EB irradiation dose of 300 kGy and acceleration voltage of 200 kV. Then the PET films on both sides were released to obtain a sample film (1). The film had a coefficient of thermal expansion of 20 ppm/° C., and no Tg was observed. The total light transmittance thereof was 92%, and the haze thereof was 0.8%.

The sample film was cut into 5-square-centimeter pieces and immersed in a vessel charged with 500 ml of acetone for ten hours. The film was taken out after the immersion and placed in a circulation type dryer at 80° C. to dry the solvent. The mass of the film after immersion in a solvent and drying the solvent was reduced by 11.3% from that of the original film. Next, the film was placed in a vacuum dryer and heated at 200° C. for one hour under reduced pressure of 0.1 kPa or less to gasify volatile components, the decrease in mass was 0.7% from the original film.

Example 2

The sample film (1) used in Example 1 was cut into 5-square-centimeter pieces and immersed in a vessel charged with 500 ml of toluene for ten hours. The film was taken out after the immersion and placed in a circulation type dryer at 80° C. to dry the solvent. The mass of the film after immersion in a solvent and drying the solvent was reduced by 10.2% from that of the original film. Next, the film was placed in a vacuum dryer and heated at 200° C. for one hour under reduced pressure of 0.1 kPa or less to gasify volatile components, the decrease in mass was 0.9% from the original film.

Example 3

The sample film (1) used in Example 1 was cut into 5-square-centimeter pieces and placed in a vacuum dryer and preheated at 200° C. for one hour under reduced pressure of 0.1 kPa or less to gasify volatile components. The mass of the film after the pre-heating treatment was reduced by 6.8% from that of the original film. Next, the film was placed in a vacuum dryer again and heated at 200° C. for one hour under reduced pressure of 0.1 kPa or less to gasify volatile components, and the decrease in mass was 0.8% from the original film.

Comparative Example 1

The sample film (1) used in Example 1 was cut into 5-square-centimeter pieces and placed in a vacuum dryer without pretreatment (immersion in a solvent and drying, or preheating treatment) and heated at 200° C. for one hour under reduced pressure of 0.1 kPa or less to gasify volatile components, and the decrease in mass was 7.2% from the original film.

In the sample films of Examples 1 to 3 which had been subjected to immersion in a solvent and drying, or preheating treatment as pretreatment, volatile components were removed by the pretreatment and the decrease in mass due to the decrease in volatile components after the subsequent treatment under vacuum was only 1% or less. To the contrary, in the film of Comparative Example 1 without the pretreatment, the decrease in mass due to the decrease in volatile components after the treatment under vacuum was as high as 7.2%.

The film in which volatile components have been removed by pretreatment can suppress the pressure generated in a vacuum vessel due to outgassing upon vacuum heating in vapor deposition treatment of the conductive thin film and the like and therefore is highly effective in the process of forming a conductive thin film.

Table 1

TABLE 1

| | Treatment method | Decrease in mass after treatment (%) | Decrease in volatile components (%) |
|---|---|---|---|
| Example 1 | Washing with acetone and drying | 11.3 | 0.7 |
| Example 2 | Washing with toluene and drying | 10.2 | 0.9 |
| Example 3 | Vacuum heating | 6.8 | 0.8 |
| Comparative Example 1 | No treatment | — | 7.2 |

The invention claimed is:

1. A method for producing a transparent composite material comprising a first step of subjecting a synthetic smectite having a number average particle diameter of from 10 to 300 nm and an aspect ratio of from 10 to 300 to organizing treatment with a quaternary ammonium salt and/or a quaternary phosphonium salt; a second step of mixing the synthetic smectite subjected to organizing treatment and a curable resin to prepare a resin composition containing the synthetic smectite in an amount of 10 to 40 mass %; a third step of curing the resin composition to obtain a cured product; and a fourth step of removing the organic volatile components remaining in the cured product, such that, when the cured product after the fourth step is heated at 200° C. for one hour under reduced pressure of 0.1 kPa or less, a decrease in mass of the cured product after heating is 1% or less from the mass of the cured product after the fourth step.

2. The method for producing a transparent composite material as claimed in claim 1, wherein the fourth step of removing the organic volatile components is washing with a solvent and/or heating the material.

3. The method for producing a transparent composite material as claimed in claim 2, wherein the heating atmosphere of the material is any one of air atmosphere, inert gas atmosphere, or vacuum atmosphere under reduced pressure.

4. The method for producing a transparent composite material as claimed in claim 1, wherein the synthetic smectite is at least one member selected from synthetic hectorite, synthetic saponite and synthetic stevensite.

5. The method for producing a transparent composite material as claimed in claim 1, wherein the quaternary organic ammonium salt is at least one of: lauryltrimethylammonium salt, stearyltrimethylammonium salt, trioctylmethylammonium salt, distearyldimethylammonium salt, di-hydrogenated beef tallow dimethylammonium salt, distearyldibenzylammonium salt and N-polyoxyethylene-N-lauryl-N,N-dimethylammonium salt.

6. The method for producing a transparent composite material as claimed in claim 1, comprising a step of treating the terminal hydroxy groups of the synthetic smectite by a surface modification agent before the second step.

7. The method for producing a transparent composite material as claimed in claim 1, wherein the curable resin is ally ester resin and/or vinyl ester resin.

8. The method for producing a transparent composite material as claimed in claim 6, wherein the surface modification agent is a silane coupling agent, a titanate coupling agent, a glycidyl compound or an isocyanate compound.

9. The method for producing a transparent composite material as claimed in claim 1, wherein a solvent is further added in the second step of preparing the resin composition.

10. The method for producing a transparent composite material as claimed in claim 3, wherein the heating atmosphere of the material is vacuum atmosphere under reduced pressure.

11. The method for producing a transparent composite material as claimed in claim 2, wherein the fourth step of removing the organic volatile components is washing with a solvent.

12. The method for producing a transparent composite material as claimed in claim 1, wherein the fourth step of removing the organic volatile components is heating under vacuum at 200° C. for one hour under reduced pressure of 0.1 kPa or less.

* * * * *